United States Patent [19]

Kantz

[11] Patent Number: 4,930,000

[45] Date of Patent: May 29, 1990

[54] TERMINAL ASSEMBLY FOR AN INTEGRATED SEMICONDUCTOR CIRCUIT

[75] Inventor: Dieter Kantz, Munich, Fed. Rep. of Germany

[73] Assignee: Siemens Aktiengesellschaft, Berlin and Munich, Fed. Rep. of Germany

[21] Appl. No.: 243,206

[22] Filed: Sep. 9, 1988

Related U.S. Application Data

[63] Continuation of Ser. No. 868,778, May 29, 1986, abandoned.

[30] Foreign Application Priority Data

May 31, 1985 [DE] Fed. Rep. of Germany ....... 3519571

[51] Int. Cl.$^5$ ..................... H01L 23/48; H01L 29/44; H01L 29/52; H01L 29/60
[52] U.S. Cl. .......................................... 357/68; 357/70
[58] Field of Search ............................... 357/68, 70, 45

[56] References Cited

U.S. PATENT DOCUMENTS 3,368,114 2/1968 Campbell et al. ..................... 357/70

FOREIGN PATENT DOCUMENTS 0127100 12/1984 European Pat. Off. ............. 357/68
59-28359 2/1984 Japan ..................................... 357/45
2061617 5/1981 United Kingdom .................. 357/68

OTHER PUBLICATIONS

IEEE International Solid-State Circuits Conference 1985, pp. 256 to 257.
IEEE International Solid-State Circuits Conference 1985, pp. 260 to 261.
IEEE International Solid-State Circuits Conference 1985, pp. 244 to 245.
IEEE International Solid-State Circuits Conference, Feb. 10, 1982, pp. 68 to 69.
IEEE International Electron Devices Meeting, Dec. 9, 1981, pp. 62 to 65.
Patents Abstracts of Japan, vol. 7, No. 229, Oct. 12, 1983.

Primary Examiner—Andrew J. James
Assistant Examiner—Sara W. Crane
Attorney, Agent, or Firm—Herbert L. Lerner; Laurence A. Greenberg

[57] ABSTRACT

A terminal assembly for an integrated semiconductor circuit includes a semiconductor chip in the semiconductor circuit having a surface, end faces, an electrically active chip surface regions of the surface adjacent the end faces, electric circuits of the semiconductor chip within the electrically active chip surface defining at least one given area of the surface within the electrically active chip surface being free of electric circuits, contact pads disposed in the regions of the surface adjacent the end faces for electrically connecting the semiconductor circuit to electrical signals and/or potentials, and other contact pads disposed in the at least one given area between the regions of the surface adjacent the end faces for electrical connection to at least some of the electrical signals and/or potentials.

7 Claims, 4 Drawing Sheets

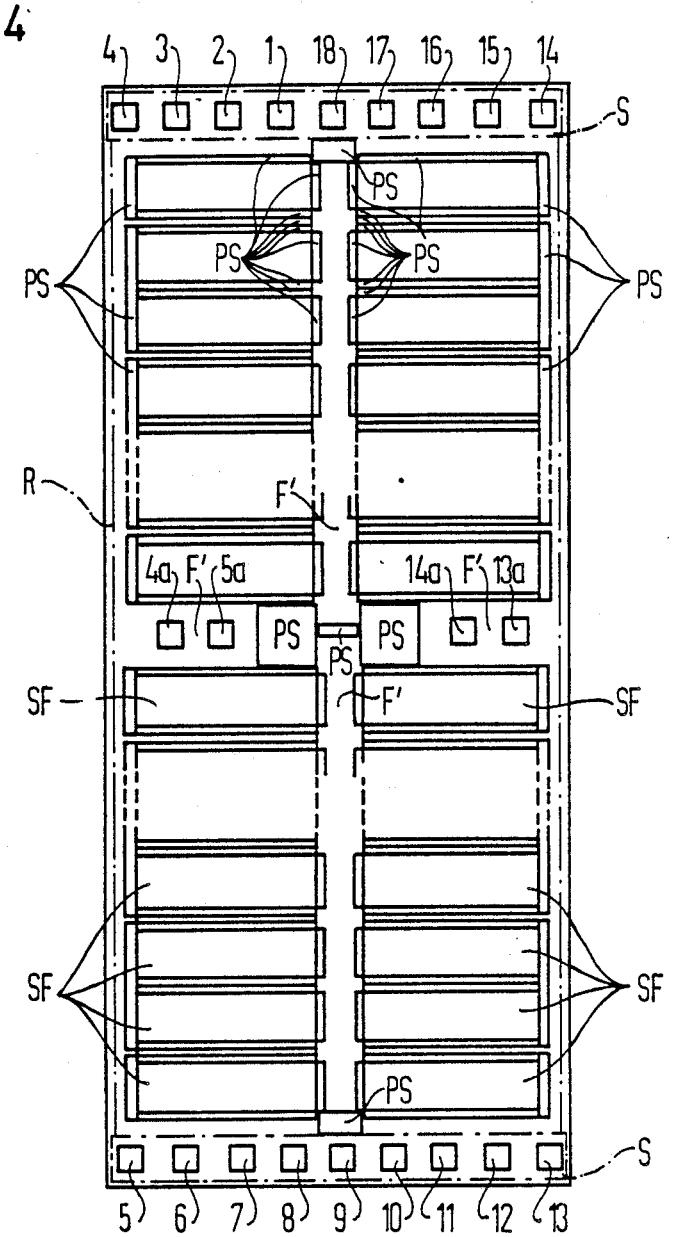

TERMINAL ASSEMBLY FOR AN INTEGRATED SEMICONDUCTOR CIRCUIT

This application is a continuation of application Ser. No. 868,778, filed May 29, 1986, now abandoned.

The invention relates to a terminal assembly for an integrated semiconductor circuit, including a plurality of contact pads for electrically connecting the semiconductor circuit to electrical signals and/or potentials, the contact pads being disposed in regions of a surface of a semiconductor chip in the semiconductor circuit adjacent end faces of the chip, and electric circuits disposed on or in the semiconductor chip, the electric circuits being disposed within an electrically active chip surface in such a way that at least one surface area is free of the circuits within the electrically active chip surface.

Modern integrated semiconductor circuits continue to become more and more complex and to require more and more chip area in spite of increasing integration density. In order to save chip area, it is known from the publication "IEEE International Solid-State Circuits Conference 1985", pages 256 to 257, especially FIG. 3 on page 360, to provide terminal pads on semiconductor chips of the semiconductor circuits exclusively on regions adjoining end faces of a surface of the semiconductor chips, for electrical connection to individual electrical signals and/or potentials by means of connecting lines. Chip area can be saved in the width of the semiconductor chip in this way. However, this type of disposition of terminals can only be applied without difficulty during the assembly of the semiconductor chip if a ceramic casing is used for the integrated semiconductor circuit.

In integrated semiconductor circuits with a plastic casing, this is only conditionally possible, since a so-called spider is generally used for the electrical connection by means of terminal leads in plastic casings, which assumes that there are contact pads on all sides of the surface of the semiconductor chip. Accordingly, semiconductor chips are used for assembly in plastic casings which have terminal pads on all sides of the surface of the semiconductor chip. However, the chip area required therefor is larger than with a semiconductor chip of the above-mentioned type for a ceramic assembly. This particularly affects the required chip width which can lead to a situation in which a casing may have to be used for assembling the semiconductor chip, which is wider than the casing provided originally. Such a terminal assembly is shown in FIG. 6, page 361 of the publication "IEEE International Solid-State Circuits Conference 1985" on pages 260 to 261.

A compromise between the above-mentioned different requirements regarding the disposition of terminal pads with regard to the two types of casings, is shown in the publication "IEEE International Solid-State Circuits Conference 1985", pages 244 to 245, especially FIG. 6, page 355. The connecting surfaces in that device are located on the regions of the surface thereof adjoining the end faces of the semiconductor chip, on one-half of a first longitudinal area beginning at a chip corner and on one-half of a second longitudinal area diagonally opposite thereto. Two halves of an electrically active chip surface with electric circuits are offset relative to each other laterally. With this configuration, it is possible to reduce the chip width by the space required of the width of a row of contact pads. Naturally, the chip width is equal to the length of an end face, as compared to an otherwise customary semiconductor circuit construction for assembly in the plastic casing. This is done while nevertheless permitting an assembly in the plastic casing. However, the chip width in this structure is still greater than with the terminal configuration described above for assembly in a ceramic casing.

It is accordingly an object of the invention to provide a contact assembly for an integrated semiconductor circuit, which overcomes the hereinafore-mentioned disadvantages of the heretofore-known devices of this general type, and which is suitable for both kinds of assembly techniques with a minimum requirement for chip area and chip width.

With the foregoing and other objects in view there is provided, in accordance with the invention, a terminal assembly for an integrated semiconductor cirtcuit, comprising a semiconductor chip in the semiconductor circuit having a surface, end faces, an electrically active chip surface, regions of the surface adjacent the end faces, electric circuits on or in the semiconductor chip within the raster field defining at least one given area of the surface within the raster field being free of electric circuits, contact pads disposed in the regions of the surface adjacent the end faces for electrically connecting the semiconductor circuit to electrical signals and/or potentials, and other contact pads disposed in the at least one given area between the regions of the surface adjacent the end faces for electrical connection to at least some of the electrical signals and/or potentials.

In accordance with another feature of the invention, the other contact pads or the first-mentioned contact pads corresponding to the other contact pads are selectively electrically connectible to the electrical signals and/or potentials.

In accordance with a further feature of the invention, the at least one given area free of electric circuits is in form of a plurality of given areas in the electrically active chip surface in which the other contact pads are disposed.

In accordance with an added feature of the invention, the plurality of given areas are geometrically separated from each other by part of the electric circuits.

In accordance with an additional feature of the invention, there are provided conductor run configurations for the electrical signals and/or potentials disposed on the given area or areas in the electrically active chip surface, independently of the presence of the other contact pads.

In accordance with a concomitant feature of the invention, the semiconductor chip has corners, and the other contact pads correspond to a plurality of the first-mentioned contact pads for the electrical signals and/or potentials disposed in the vicinity of the corners.

With the assembly according to the invention, it is possible to use plastic casings with a requirement as to chip area and chip width for the semiconductor chip of a semiconductor circuit that is set for ceramic casings described above. The invention can be applied to all known semiconductor circuits. It is particularly well suited for semiconductor circuits with many regular structures as exhibited especially in microprocessors and integrated semiconductor memories.

Other features which are considered as characteristic for the invention are set forth in the appended claims.

Although the invention is illustrated and desscribed herein as embodied in a terminal assembly for an integrated semiconductor circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIG. 4 is a view similar to FIG. 1 of another embodiment of the invention.

Figure 1:
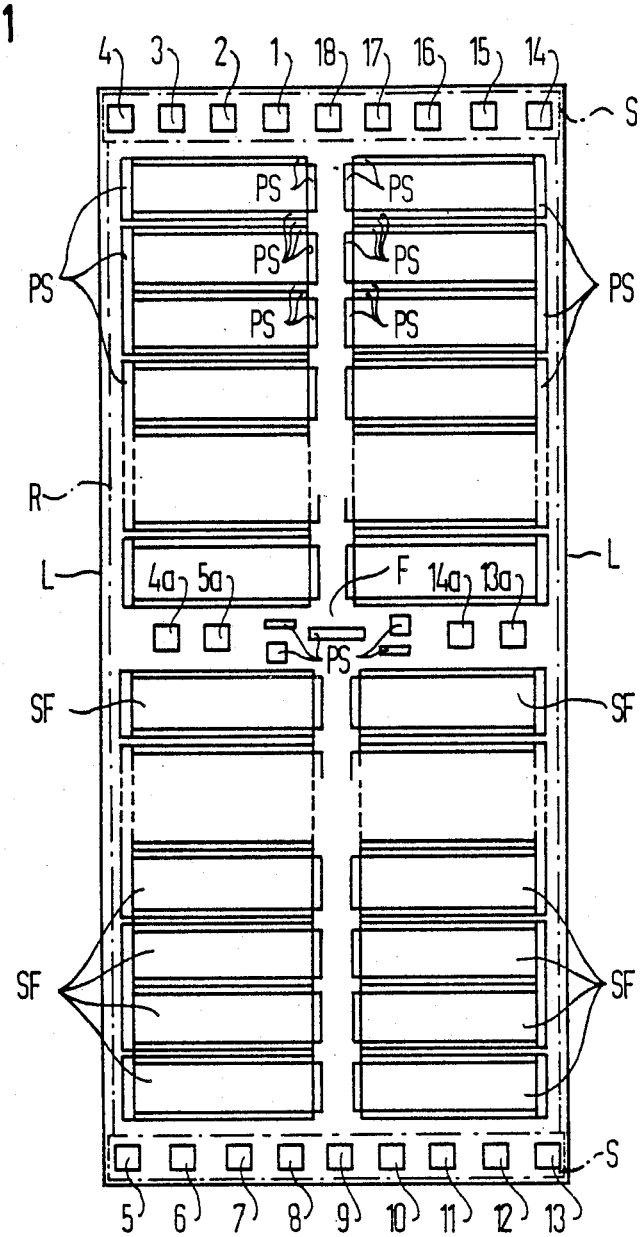
FIG. 1 is a top-plan view of a semiconductor chip with a contact assembly according to the invention.

Referring now to the figures of the drawings in detail and first, particularly to FIG. 1 thereof, there is seen a top view of a semiconductor chip with a contact assembly according to the invention. In order to obtain a large enough overview, a semiconductor memory with many, mostly regularly repeated electric circuits SF, PS and with a surface area F free of the circuits, has been shown. The circuits designated with reference symbol SF each represent a memory field. The circuits designated with reference symbol PS represent so-called peripheral circuits such as address coders, read amplifiers and similar devices. The electric circuits SF, PS and the empty surface area F together form an electrically active chip surface R. According to the invention, the electrically active chip surface can also have several surface areas F' instead of one surface area F. According to FIG. 4, these surface areas F' can advantageously be geometrically separated from each other by a part of the electric circuits SF, PS. Besides the raster field R, the semiconductor chip itself comprises two relatively narrow regions S of one of its surfaces which are adjacent end faces of the chip and two longitudinal sides L which are relatively long as compared to the length of the end faces, forming a lateral or side margin. The electrically active chip surface R extends laterally almost to the lateral edge of the semiconductor chip. In order to save space, the semiconductor chip has no contact pads at all at the longitudinal or long sides L. All electrically required contact pads 1 to 18 of the semiconductor chip are disposed in the regions S adjacent the end faces or surfaces. As described thus far, the illustrated semiconductor chip corresponds to a semiconductor chip according to the state of the art, for a ceramic assembly. According to the invention, in addition to the electrically required contact pads 1 to 18 within the electrically active chip surface R, the surface region F of the semiconductor chip has other contact pads 4a, 5a, 13a and 14a. The other contact pads 4a, 5a, 13a and 14a can also be disposed in several surface areas F', according to the invention. The surface areas F' with the other contact pads 4a, 5a, 13a, 14a can also be advantageously separated from each other geometrically by part of the electric circuits SF, PS, as seen in FIG. 4. The other contact pads 4, 5a, 13a, 14a also serve for the electrical connection of at least some of the electrical signals and/or potentials of the semiconductor chip. Due to the fact that the other contact pats are located within the electrically active chip surface R and due to the fact that the geometry of the electrically active chip surface is independent of the other contact pads 4a, 5a, 13a and 14a, at least as to its width, no additional surface is needed on the semiconductor chip. In particular, the semiconductor chip has a minimal width which is substantially equal to the width of the electrically active chip surface R.

Another advantage is that the other contact pads 4a, 5a, 13a, 14a are contact pads of signals and/or potentials having a conductor run configuration within the electrically active chip surface R which already uses the empty surface area F independently of the existence of the other contact pads 4a, 5a, 13a, 14a. It is therefore possible to place the other contact pads 4a, 5a, 13a, 14a in the empty surface area F in accordance with the invention, without additional expenditures for area and conductor runs.

Figure 3:
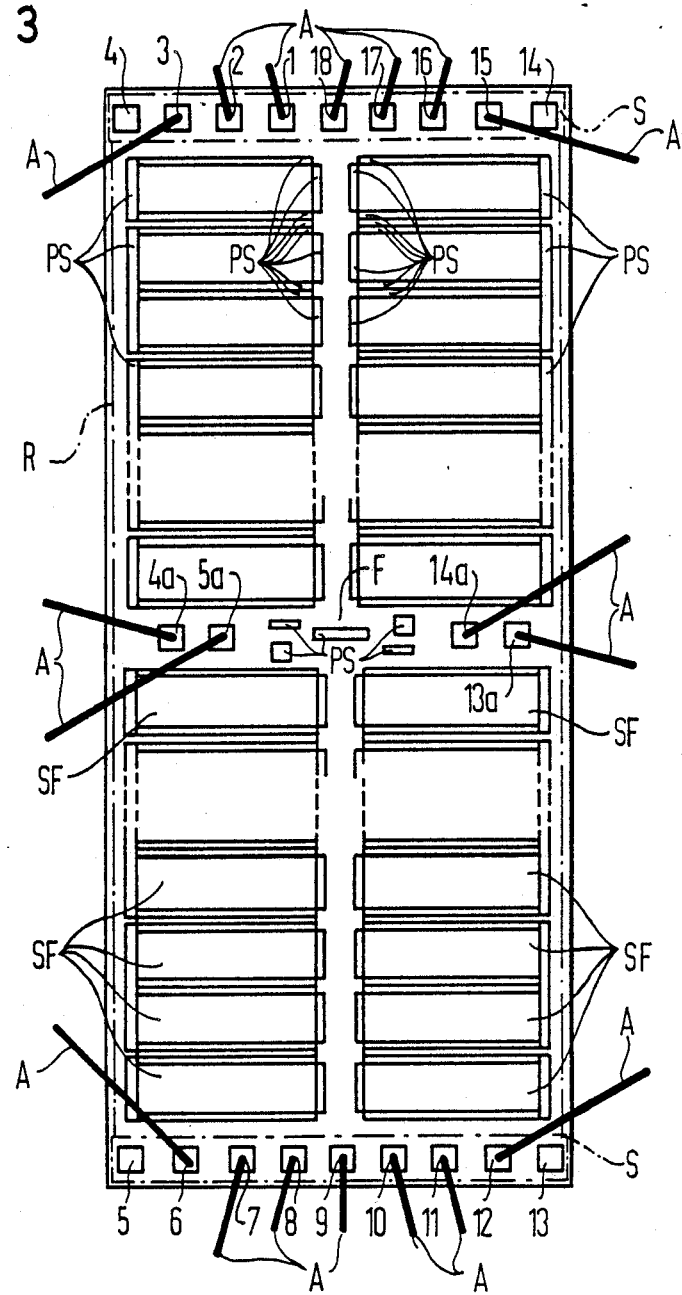
FIG. 3 is a view of the semiconductor chip according to FIG. 1, with contacts for a plastic casing.

It is also advantageous for the other contact pads 4a, 5a, 13a and 14a to be contact pads for signals and/or potentials having contact pads 4, 5, 13 and 14 disposed at the regions S adjoining the end faces in the vicinnity of chip corners. This is because routing connections through the electrically active chip surface R is avoided to a very great degree in the case of an electrical connection by means of a connecting line A within a plastic casing for fabricating the integrated circuit, as is shown in FIG. 3. This also results in a reduction of the danger of an electric short circuit between the connecting lines A and the electric circits SF, PS of the electrically active chip surface R.

Figure 2:
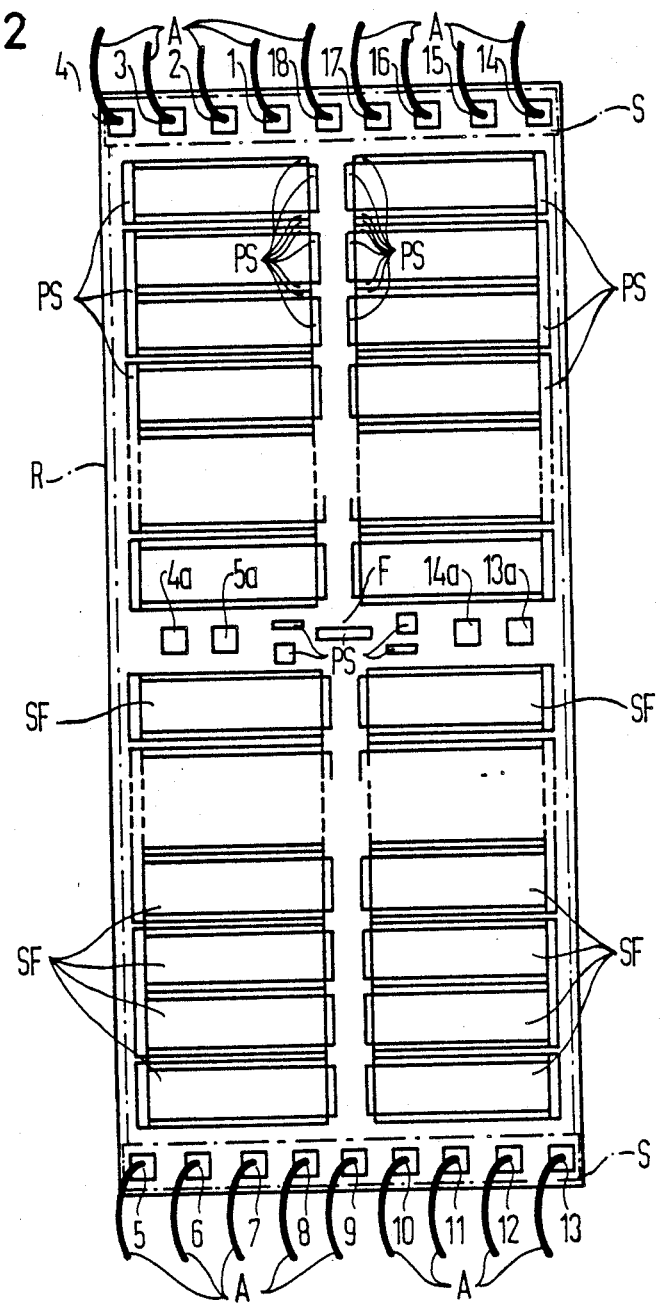
FIG. 2 is a view of the semiconductor chip according to FIG. 1, with contacts for a ceramic casing.

The contact pads 1 to 18 serve to provide an electrical connection with connecting lines A within a ceramic housing for fabricating the integrated circuit. The other contact pads 4a, 5a, 13a, 14a remain unused and unconnected. A circuit wired in this manner is shown in FIG. 2. The contact pads 1, 2, 3, 6 to 12, 15 to 18 as well as the other contact pads 4a, 5a, 13a and 14a serve for making the electrical connection by means of connecting lines A within a plastic casing for fabricating the integrated circuit. The contact pads 4, 5, 13 and 14 remain unused. A circuit wired in this manner is shown in FIG. 3.

In both afore-mentioned contacting possibilities, the unused contact pads (4a, 5a, 13a, 14a and 4, 5, 13, 14, respectively) can remain unchanged from the condition which they are in after the fabrication of the semiconductor chip. In general, they need not be provided with any terminating resistors, nor is there a need for their corresponding conductor runs to be interrupted.

The foregoing is a description corresponding in substance to German application No. P 35 19 571.1, filed May 31, 1985, the International priority of which is being claimed for the instant application, and which is hereby made part of this application. Any material discrepancies between the foregoing specification and the aforementioned corresponding German application are to be resolved in favor of the latter.

I claim:

1. Connecting arrangement for an integrated semiconductor circuit, comprising:
   a semiconductor chip having a main surface and two opposite end surfaces; two contact regions within the main surface, each disposed adjacent a respective end surface and each having a respective first and second plurality of contact pads therein;
   an electrically active surface within the main surface, disposed between the contact regions;
   a first and a second circuit area disposed within said electrically active surface, each being adjacent a respective contact region; said first and second circuit area having first and second electrical circuit elements connected with said first and second plurality of contact pads in said contact regions;

at least one surface area free of electrical circuit elements disposed within said electrically active surface;

a further contact region having a third plurality of contact pads therein connected with said second circuit elements in said first and second circuit area, disposed within said electrically active surface; said further contact region disposed within said at least one surface area free of electrical circuit elements; and wherein at least one of said contact pads in said further contact region is redundantly connected with a respective circuit element of said second electrical circuit elements.

2. Connecting arrangement according to claim 1, including a plurality of connecting leads, wherein a part of said connecting leads are connected to said first plurality of contact pads, and the remaining connecting leads are connected to said second plurality of contact pads.

3. Connecting arrangement according to claim 1, including a plurality of connecting leads; wherein a first part of said connecting leads are connected to said first plurality of contact pads, and the remaining part of the connecting leads are connected with said third plurality of contact pads.

4. Connecting arrangement according to claim 1, including a plurality of surface areas free of electrical circuit elements, disposed within said electrically active surface, and wherein said third plurality of contact pads are disposed within one of said surface areas free of electrical circuit elements.

5. Connecting arrangement according to claim 4, wherein said third plurality of contact pads are geometrically separated into at least two groups of further contact pads by at least a part of said electrical circuit elements.

6. Connecting arrangement according to claim 1, wherein said electrical circuit elements form active electrical circuits disposed below said electrically active surface, and said circuits have conductor runs for electrical signals and/or potentials of said electrical circuit elements in said first and second circuit area, said conductor runs being selected such that they are positioned upon said circuit-free surface independently of presence of connecting pads on said circuit-free surface.

7. Connecting arrangement according to claim 1, wherein the second plurality of connecting pads are positioned in proximity of the corners of the semiconductor chip.

* * * * *